United States Patent [19]

Bovino et al.

[11] Patent Number: 4,625,182

[45] Date of Patent: Nov. 25, 1986

[54] OPTICALLY TRIGGERED BULK DEVICE GUNN OSCILLATOR

[75] Inventors: Lawrence J. Bovino, Eatontown; Maurice Weiner, Ocean; Terence Burke, New Brunswick, all of N.J.

[73] Assignee: The United States of America as represented by the Secretary of the Army, Washington, D.C.

[21] Appl. No.: 791,672

[22] Filed: Oct. 28, 1985

[51] Int. Cl.[4] .............................................. H03B 9/12
[52] U.S. Cl. .................................. 331/107 G; 331/66; 307/311; 357/3
[58] Field of Search .............. 331/66, 107 G, 107 DP; 357/3, 30; 307/311

[56] References Cited

U.S. PATENT DOCUMENTS

| 3,440,425 | 4/1969 | Hutson et al. | 331/107 G X |
|---|---|---|---|
| 3,562,667 | 2/1971 | Solomon et al. | 331/107 G |
| 3,579,143 | 5/1971 | Haydl | 331/107 G |
| 3,651,423 | 3/1972 | Sewell | 331/66 |
| 3,651,426 | 3/1972 | Boatner et al. | 331/107 G |
| 3,795,803 | 3/1974 | Ancker-Johnson | 250/338 |
| 4,481,485 | 11/1984 | Carruthers et al. | 331/66 |

OTHER PUBLICATIONS

"Microwave Oscillations of Current in III–V Semiconductors", J. B. Gunn; Solid State Comm, vol. 1, pp. 88–91, 1963.
"Microwave Amplification in a D.C.-Biased Bulk Semiconductor", H. W. Thim, et al, Appl. Physics Lett., vol. 7, No. 6, Sep. 15, 1965, pp. 167–168.
"Optically Triggerable Domains in GaAs Gunn Diodes", R. F. Adams, et al, Appl. Physics Lett., vol. 15, No. 8, Oct. 15, 1969, pp. 265–267.
"Oscillation Burst Generation in Transferred-Electron Devices with Picosecond Optical Pulses", T. F. Carruthers, et al.; Appl. Physics Lett. vol. 38, No. 4, Feb. 15, 1981, pp. 202–204.

Primary Examiner—Siegfried H. Grimm
Attorney, Agent, or Firm—Anthony T. Lane; Jeremiah G. Murray; John T. Rehberg

[57] ABSTRACT

A high power solid state source of microwave and millimeter wave signals is provided by an optically triggered body of bulk semiconductor material selected from the Group III-V compounds including GaAs, Cr:GaAs, and Fe:InP and having a relatively long gap length which is in the order of 0.5 to 10.0 mm as well as having a resistivity which is greater than $1 \times 10^7$ ohm-cm. The device is further dc biased to a field of between 15 kV/cm and 35 kV/cm. Under such conditions, a very low dc current flows without any oscillatory behavior; however, illumination of the semiconductor body with a fast rising optical pulse having a wavelength suitable for carrier generation causes electrons to be lifted to the conduction band which is accompanied by a rapid reduction of the resistivity. At the same time, the electric field across the gap length decreases to a value just above the oscillation threshold whereupon high power RF oscillations are generated whose frequency is a function of the recombination time of the excited carriers.

12 Claims, 2 Drawing Figures

FIG.1
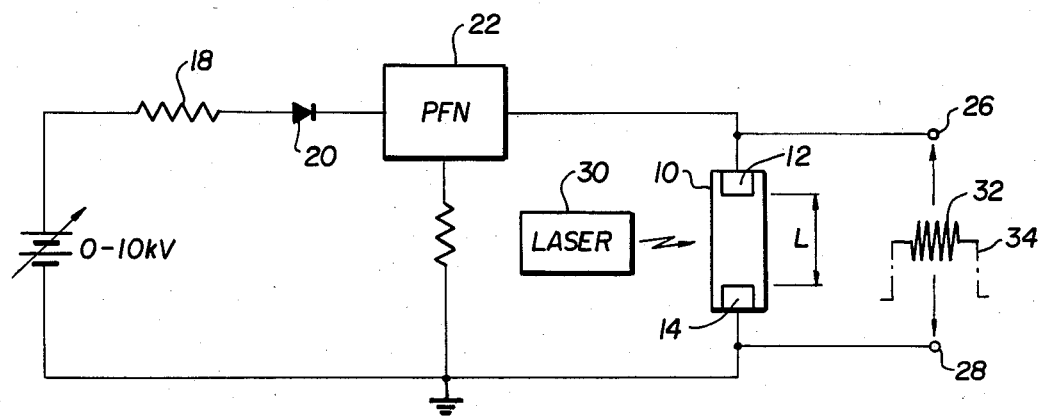
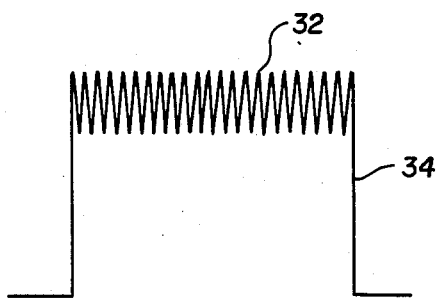
FIG.2

OPTICALLY TRIGGERED BULK DEVICE GUNN OSCILLATOR

This invention may be manufactured and used by or for the Government for governmental purposes without the payment of any royalties thereon or therefor.

BACKGROUND OF THE INVENTION

1. Field of the Invention

This invention pertains to a source of RF power utilizing semiconductor devices and more particularly to a source of microwave/millimeter wave signals utilizing an optically triggered Gunn effect device.

2. Description of the Prior Art

The use of gallium arsenide (GaAs) and indium phosphide (InP) semiconductors as a source of RF power is well known, having been described, for example, in an article by J. B. Gunn entitled, "Microwave Oscillations of Current in III–V Semiconductors", which appeared in *Solid State Communications,* Vol. 1, pp. 88–91 (1963). In that publication, the Gunn effect is disclosed. Gunn oscillations are produced when n-type GaAs, for example, is biased into negative mobility region. The negative mobility gives rise to carrier bunching which are then swept through the drift region giving rise to RF oscillations. The oscillation frequency is approximately equal to the reciprocal of the transit time across the drift region, typically 1 GHz for a sample with a gap length of the order of 0.1 millimeter. These oscillations, moreover, appear as an RF signal superimposed on a video pulse and appear when the fields across the semiconductor are in the range of 2–4 kV/cm.

Optical control of Gunn effect devices is also known. However, in such devices, an optical signal is used either to: (1) permit operation at lower voltages, (2) provide frequency stabilization, or (3) provide frequency flexibility, or otherwise improve the range or efficiency of the oscillator. Such optically controlled devices provide no increase in output power. The devices, moreover, are fabricated from relatively low resistivity material which is in the range of 2 to 10 ohms-cm. Some of these devices are initially biased below the threshold field for oscillation (approximately 3 kV/cm) and are then selectively illuminated with light of a wavelength which is suitable for carrier generation in the specific materials. Increased conductivity in the illuminated region causes the field to collapse in that region and correspondingly to increase to a value above the oscillation threshold in the unilluminated region. The RF oscillations then begin in the unilluminated region and propagate through the device. On the other hand, some of the known devices are biased at or slightly above the threshold electrical field for oscillation and allowed to oscillate prior to optical stimulation. Uniform or selective illumination is then employed to vary oscillation frequency, stabilize oscillation frequency or to terminate the oscillations. The oscillation frequency, moreover, is determined spatially i.e. either by device geometry or illumination pattern or both.

Accordingly, it is an object of the present invention to provide an improvement in microwave and millimeter wave generators.

It is another object of the invention to provide an improvement in oscillators utilizing Gunn effect devices.

Yet another object of the invention is to provide an improvement in bulk semiconductor device Gunn oscillators.

Still another object of the invention is to provide a Gunn type oscillator providing a significant increase in RF peak power output level.

SUMMARY OF THE INVENTION

The foregoing and other objects of the invention are achieved through a Gunn effect device oscillator including a body of Group III-V bulk semiconductor material having a relatively high resistivity, greater than $1 \times 10^7$ ohm/cm, and a relatively long gap length, between 0.5 and 3.0 mm. Optical pulses having a fast rise time are directed to the body of bulk material which is additionally biased to a field of 15 kV/cm and 35 kV/cm by a variable voltage source. Application of a light pulse from an Nd:YAG laser of high power GaAs laser diode causes the resistivity of the material to drop rapidly. At the same time, the electric field across the device decreases to just above the oscillation threshold level (3.2 kV/cm–4.0 kV/cm), at which time high power oscillations will be generated. Due to the extremely high resistivity of the semiconductor material utilized, RF oscillations will not occur at any bias voltage without an optical input. Moreover, the frequency of oscillation is not determined spatially, but is dependent on the relaxation time of the excited carriers.

BRIEF DESCRIPTION OF THE DRAWINGS

While the present invention is defined in the claims annexed to and forming a part of the specification, a better understanding can be had by reference to the following description when taken in conjunction with the accompanying drawings in which:

FIG. 1 is an electrical schematic diagram illustrative of the preferred embodiment of the invention; and FIG. 2 is a pulse type of diagram illustrative of the operation of the subject invention.

DETAILED DESCRIPTION OF THE INVENTION

Referring now to the drawings and more particularly to FIG. 1, the schematic diagram disclosed thereat is illustrative of an optically triggered Gunn effect oscillator which is comprised of a body 10 of Group III-V semiconductor material which has a pair of ohmic contacts 12 and 14 formed at the extremities thereof and which are separated by a relatively long gap length L which ranges between 0.5 and 10.0 mm. The semiconductor material is preferably comprised of gallium arsenide (GaAs) or chromium doped galium arsenide (Cr:GaAs) having an extremely high resistivity in the range of $1 \times 10^7$ to $6 \times 10^7$ ohm/cm. When desirable, however, the device 10 may be configured from iron doped indium phosphide (Fe:InP). The body 10 of GaAs in FIG. 1 is biased by means of a variable high voltage (0–10 kV) dc power supply 16 which is operable to generate an electric field across the ohmic contacts 12 and 14 in the range of between 15 kV/cm and 35 kV/cm. This biasing potential furthermore is applied through a charging resistor 18, a blocking diode 20 and a pulse forming network 22 which additionally includes a load resistor 24 coupled to the point of common reference potential which is illustrated as ground. A pair of output terminals 26 and 28 are coupled across the GaAs device 10 by being connected to the ohmic contacts 12 and 14, respectively.

The gap length L of the device 10 is periodically illuminated with a fast rising optical pulse generated, for example, by a laser device 30, typically an Nd:YAG laser, whose output when pulsed is of a wavelength which generates free carriers, in the conduction band, substantially across the entire gap length. This causes a rapid reduction of the resistivity of the semiconductor device 10. When the bias voltage, circuit impedance and optical power are all adjusted such that carrier concentration is increased to the range which meets the criteria for oscillation, which is approximately $10^{14}/cm^3$ to $10^{17}/cm^3$, the electric field across the device 10 will simultaneously decrease to the range of 3.2 kV/cm to 4.0 kV/cm which is just above the oscillation threshold whereupon high power RF oscillations will occur as shown by reference numeral 32 of FIG. 2 located on top of a video pulse 34. The pulse forming network 22 is utilized to aid the delivery of current to the semiconductor body 10 during the oscillatory mode.

Based on experimental observation, the frequency of oscillation of the signal 32 appears to be controlled by the recombination time of the constituent material and accordingly the lifetimes of the excited carriers, which is approximately 1 to 10 nanoseconds for GaAs and as short as 50 picoseconds for Fe:InP, as opposed to spatial considerations involving prior art devices wherein the transit time across the gap length (device geometry) or illumination pattern from an optical source governs frequency. This is supported by the fact that the same oscillation frequency of approximately 1 GHz was observed for gap length of various dimensions varying between 1.0 mm and 10 mm.

Furthermore, due to the extremely high resistivity of the semiconductor material used, RF oscillations will not occur at any bias voltage without an optical input; however, when triggered by a laser pulse from the laser 30 of FIG. 1, RF signals in the kilowatt range are generated. The use of this extremely high resistivity material thus permits biasing at substantially higher fields than is possible with existing Gunn effect devices. This, coupled with the fact that the device 10 shown in FIG. 1 is large compared to existing Gunn devices, means that the voltages can be typically 100 times greater than those used in present Gunn oscillator circuits. With such a device, electric fields which are 10 times the threshold field for Gunn oscillations are applied but no oscillations occur without illumination and only a very low dc current in the order of microamperes exists in absence of a triggering pulse. During illumination, however, circuit currents will be considerably higher, corresponding to the high voltages at similar circuit impedances. At these higher levels of electrical power, higher RF powers, on the order of 10 times those of existing Gunn devices, are generated.

The light triggered Gunn oscillator of the present invention offers advantages not available in conventional Gunn effect devices. Because the light signal utilized to trigger the oscillation is electrically isolated from the RF circuitry, a less noisy operational environment is provided which in turn is conducive to providing a cleaner RF signal. Another advantage relates to the modulation pulse of the RF signal. Since carriers may be generated instantly throughout the gap length L shown in FIG. 1, the rise time of the RF pulse can be extremely fast, limited only by the rise time of the light pulse. This means that very high speed narrow pulses can be generated. In addition, the RF power output from the narrow pulse exhibits greater peak power than that achievable in conventional devices. In the known prior art type of Gunn oscillators, the RF intensity is achieved only after the wave front has traversed the entire drift region, whereas in the subject invention, carriers are generated instantly throughout the gap length L and contributions to the output are made by the entire region. Also, higher peak powers are obtainable because the constituent semiconductor material due to its high resistivity can be biased to very high voltages, i.e. several kilovolts per millimeter. An additional advantage has to do with the ability of the light beam to scan an array of semiconductor elements very rapidly which lends itself to RF beam steering when desired. Such an array can also be utilized to provide an analog to digital conversion of the RF signal.

Having shown and described what is at present considered to be the preferred embodiment of the invention, it should be noted that the same has been made by way of illustration and not limitation. Accordingly, all modifications, alterations and changes coming within the spirit and scope of the invention are herein meant to be included.

We claim:

1. A microwave/millimeter wave signal generator comprising:
    a Gunn effect device comprised of material having an electrical resistivity greater than $1\times10^7$ ohm/cm and including a pair of ohmic contacts formed on the terminal ends thereof with the distance between said contacts defining a gap having a gap length of at least 0.5 millimeters;
    means for applying a relatively high bias potential across said device for generating an electrical field thereacross which is substantially beyond the oscillation threshold of said device but wherein oscillations are inhibited in absence of optical energy impinging thereon due to the extremely high resistivity of the material of said device;
    an optical source for periodically illuminating said device whereupon carriers are generated across said gap causing a reduction of the resistivity of the device which is accompanied by a decrease of the electrical field across the device to the oscillation threshold level, whereupon relatively high power RF oscillations appear across said ohmic contacts and whose frequency is determined by the recombination time of the carriers generated in said material by said optical source; and
    means coupled across said ohmic contacts for sensing said RF oscillations.

2. The microwave signal generator as defined by claim 1 wherein said material comprising said Gunn effect device comprises Group III–V bulk semiconductor material.

3. The microwave signal generator as defined by claim 2 wherein said Group III–V semiconductor material comprises a body of gallium arsenide (GaAs) or chromium doped gallium arsenide (Cr:GaAs).

4. The microwave signal generator as defined by claim 2 wherein said Group III–V semiconductor material comprises a body of iron doped indium phosphide (Fe:InP).

5. The microwave signal generator as defined by claim 2 wherein said gap length is in the range of between 0.5 and 10.0 millimeters.

6. The microwave signal generator as defined by claim 5 wherein said means for applying a relatively high bias potential comprises means for generating an electric field of between 15 kV/cm and 35 kV/cm across said device.

7. The microwave signal generator as defined by claim 6 wherein the resistivity of said material comprising the Gunn effect device ranges between $1 \times 10^7$ ohm/cm and $6 \times 10^7$ ohm/cm.

8. The microwave signal generator as defined by claim 2 wherein said optical source comprises a laser generating an optical signal having a wavelength which is adapted to free electrons in the conduction band of said bulk semiconductor material.

9. The microwave signal generator as defined by claim 8 wherein said laser comprises a pulse type laser.

10. The microwave signal generator as defined by claim 8 wherein said laser comprises an Nd:YAG laser.

11. The microwave signal generator as defined by claim 2 and additionally including a pulse forming network coupled between said Gunn effect device and said means for applying said bias potential, said pulse forming network being operable to aid the delivery of current to said device from said means for applying said bias potential when RF oscillations are being generated.

12. The microwave signal generator as defined by claim 2 wherein said means for applying a relatively high bias potential comprises a high voltage dc power supply.

* * * * *